(12) United States Patent
Chou et al.

(10) Patent No.: US 10,362,691 B2
(45) Date of Patent: Jul. 23, 2019

(54) TOUCH-CONTROLLING DEVICE, FUNCTIONAL EXPANSION MEMBER THEREOF, AND USB SOCKET CONNECTOR (71) Applicants: BCM Communication Co., Ltd, Taipei (TW); Ufro Inc, Taipei (TW)

(72) Inventors: Kao-Jung Chou, Taipei (TW); Hsien-Chuan Kuo, Taipei (TW); Hung-Yu Lin, Taipei (TW)

(73) Assignees: BCM COMMUNICATION CO., LTD, Taipei (TW); UFRO INC, Taipei (TW)

(*) Notice: Subject to any disclaimer, the term of this patent is extended or adjusted under 35 U.S.C. 154(b) by 0 days.

(21) Appl. No.: 15/821,931

(22) Filed: Nov. 24, 2017

(65) Prior Publication Data
US 2019/0104619 A1    Apr. 4, 2019

(30) Foreign Application Priority Data

Sep. 29, 2017    (TW) .............................. 106214515 U (51) Int. Cl.
B43K 29/08    (2006.01)
B43K 23/08    (2006.01)
(Continued)

(52) U.S. Cl.
CPC ........... H05K 5/003 (2013.01); G06F 3/0386 (2013.01); G06F 3/03542 (2013.01); G06F 3/041 (2013.01); H01R 12/52 (2013.01); H01R 13/50 (2013.01); H01R 13/6581 (2013.01); H01R 24/60 (2013.01); H05K 1/117 (2013.01); H05K 1/141 (2013.01); H05K 1/181 (2013.01); H05K 5/0039 (2013.01); H05K 5/0086 (2013.01); H05K 2201/044 (2013.01); H05K 2201/09027 (2013.01); H05K 2201/10053 (2013.01); H05K 2201/10106 (2013.01); H05K 2201/10121 (2013.01); H05K 2201/10522 (2013.01); H05K 2201/10545 (2013.01)

(58) Field of Classification Search
USPC ........................................................ 345/179
See application file for complete search history.

(56) References Cited

U.S. PATENT DOCUMENTS

2007/0184685 A1*  8/2007  Hsueh ................. G06F 12/1416
                                                        439/76.1
2016/0308527 A1* 10/2016  Kim ..................... H03K 19/003

* cited by examiner

Primary Examiner — Jennifer Mehmood
Assistant Examiner — Deeprose Subedi
(74) Attorney, Agent, or Firm — Li & Cai Intellectual Property (USA) Office (57) ABSTRACT A USB socket connector includes a columnar housing, a circuit board, and an expansion board. The columnar housing has a front portion and an opposite rear portion. The columnar housing includes an accommodating slot recessed from the front portion toward the rear portion and a receiving slot recessed on the rear portion and in air communication with the accommodating slot. A cross section of the receiving slot is larger than that of the accommodating slot. The circuit board includes a tongue plate portion arranged on one side thereof and having a USB3.1 Type-C interface. The circuit board is inserted into the accommodating slot, and the tongue plate portion is arranged in the front portion. The expansion board is substantially and perpendicularly connected to an end of the circuit board away from the tongue plate portion, and the expansion board is arranged in the receiving slot.

19 Claims, 9 Drawing Sheets (51) Int. Cl.
   *G06F 3/0488*      (2013.01)
   *H05K 5/00*        (2006.01)
   *H05K 1/14*        (2006.01)
   *H05K 1/11*        (2006.01)
   *H01R 24/60*       (2011.01)
   *H01R 13/6581*     (2011.01)
   *H01R 13/50*       (2006.01)
   *H05K 1/18*        (2006.01)
   *G06F 3/041*       (2006.01)
   *G06F 3/0354*      (2013.01)
   *G06F 3/038*       (2013.01)
   *H01R 12/52*       (2011.01)

FIG. 10

TOUCH-CONTROLLING DEVICE, FUNCTIONAL EXPANSION MEMBER THEREOF, AND USB SOCKET CONNECTOR

BACKGROUND OF THE INVENTION

1. Field of the Invention

The present disclosure relates to a USB connector; in particular, to a touch-controlling device, a functional expansion member thereof, and a USB socket connector.

2. Description of Related Art

A conventional USB socket connector (e.g., a USB3.1 Type-C socket connector) includes a tongue plate and a metallic shielding cover, and the metallic shielding cover is formed by bending a metallic sheet to cover around the tongue plate. However, structure of a mating device needs to be formed according to the shape of the metallic shielding cover, resulting in the range of application and the development of the conventional USB socket connector to be subjected to the metallic shielding cover.

SUMMARY OF THE INVENTION

The present disclosure provides a touch-controlling device, a functional expansion member thereof, and a USB socket connector to effectively overcome the drawbacks associated with conventional USB socket connectors.

The present disclosure discloses a touch-controlling device, which includes a touch-controlling pen and a functional expansion member. The touch-controlling pen includes a touch-controlling nib and a USB plug connector both respectively arranged on two opposite ends thereof. The USB plug connector has a USB3.1 Type-C interface. The touch-controlling pen includes a power module electrically connected to the touch-controlling nib and the USB plug connector. The functional expansion member includes a USB socket connector and a functional module mounted on the USB socket connector. The USB socket connector is detachably inserted into the USB plug connector of the touch-controlling pen and includes a columnar housing, a circuit board, and an expansion board. The columnar housing has a front portion and a rear portion both respectively arranged on two opposite sides thereof. The columnar housing has an accommodating slot recessed from the front portion toward the rear portion and a receiving slot recessed on the rear portion and in air communication with the accommodating slot. A cross section of the receiving slot perpendicular to a longitudinal direction of the columnar housing is larger than that of the accommodating slot. The circuit board includes a tongue plate portion arranged on one side thereof, and the tongue plate portion has a USB3.1 Type-C interface. The circuit board is inserted into the accommodating slot, and the tongue plate portion is arranged in the front portion. The expansion board is substantially and perpendicularly connected to an end of the circuit board away from the tongue plate portion. The expansion board is arranged in the receiving slot, and the functional module is mounted on an outer surface of the expansion board non-connected to the circuit board. When the USB plug connector of the touch-controlling pen is inserted into the USB socket connector of the functional expansion member, the USB plug connector is inserted into the accommodating slot and is electrically connected to the tongue plate portion so as to establish an electrical connection between the functional module and the touch-controlling pen, and the power module of the touch-controlling pen is capable of providing electricity to the functional module.

The present disclosure also discloses a functional expansion member of a touch-controlling device, and the functional expansion member includes a USB connector and a functional module. The USB connector includes a columnar housing, a circuit board, and an expansion board. The columnar housing has a front portion and a rear portion both respectively arranged on two opposite sides thereof. The columnar housing has an accommodating slot recessed from the front portion toward the rear portion and a receiving slot recessed on the rear portion and in air communication with the accommodating slot. A cross section of the receiving slot perpendicular to a longitudinal direction of the columnar housing is larger than that of the accommodating slot. The circuit board includes a tongue plate portion arranged on one side thereof, and the tongue plate portion has a USB3.1 Type-C interface. The circuit board is inserted into the accommodating slot, and the tongue plate portion is arranged in the front portion. The expansion board is substantially and perpendicularly connected to an end of the circuit board away from the tongue plate portion. The expansion board is arranged in the receiving slot. The functional module is mounted on the expansion board of the USB socket connector and includes a processor, a color extractor electrically connected to the processor, a light-emitting unit for emitting a white light, and a starter electrically connected to the color extractor and the light-emitting unit. The starter is pressable to drive the color extractor and the light-emitting unit.

The present disclosure further discloses a USB socket connector, which includes a columnar housing, a circuit board, and an expansion board. The columnar housing has a front portion and a rear portion both respectively arranged on two opposite sides thereof. The columnar housing has an accommodating slot recessed from the front portion toward the rear portion and a receiving slot recessed on the rear portion and in air communication with the accommodating slot. A cross section of the receiving slot perpendicular to a longitudinal direction of the columnar housing is larger than that of the accommodating slot. The circuit board includes a tongue plate portion arranged on one side thereof, and the tongue plate portion has a USB3.1 Type-C interface. The circuit board is inserted into the accommodating slot, and the tongue plate portion is arranged in the front portion. The expansion board is substantially and perpendicularly connected to an end of the circuit board away from the tongue plate portion, and the expansion board is arranged in the receiving slot.

In summary, the touch-controlling device, the functional expansion member, or the USB socket connector in the present disclosure is provided with the columnar housing to replace the conventional metallic shielding cover, so that the applied field of the USB socket connector (i.e., the USB socket connector can be applied to a touch-controlling pen) is more wide-ranging than that of the conventional USB socket connector.

Moreover, the functional module of the functional expansion member in the present disclosure is provided with a color capturing function, so that the touch-controlling pen collaborating with the functional expansion member has higher value added. For the structure of the touch-controlling device, the functional expansion member is just cooperated with the USB plug connector of the touch-controlling pen, so that the structure of the touch-controlling pen needs not to be changed for the functional expansion member, thereby effectively reducing the cost of the touch-controlling device.

In order to further appreciate the characteristics and technical contents of the present disclosure, references are hereunder made to the detailed descriptions and appended drawings in connection with the present disclosure. However, the appended drawings are merely shown for exemplary purposes, and should not be construed as restricting the scope of the present disclosure.

DETAILED DESCRIPTION OF THE PREFERRED EMBODIMENTS

Reference is made to FIGS. 1 to 10, which illustrate the present disclosure. References are hereunder made to the detailed descriptions and appended drawings in connection with the present disclosure. However, the appended drawings are merely provided for exemplary purposes, and should not be construed as restricting the scope of the present disclosure.

Figure 1:
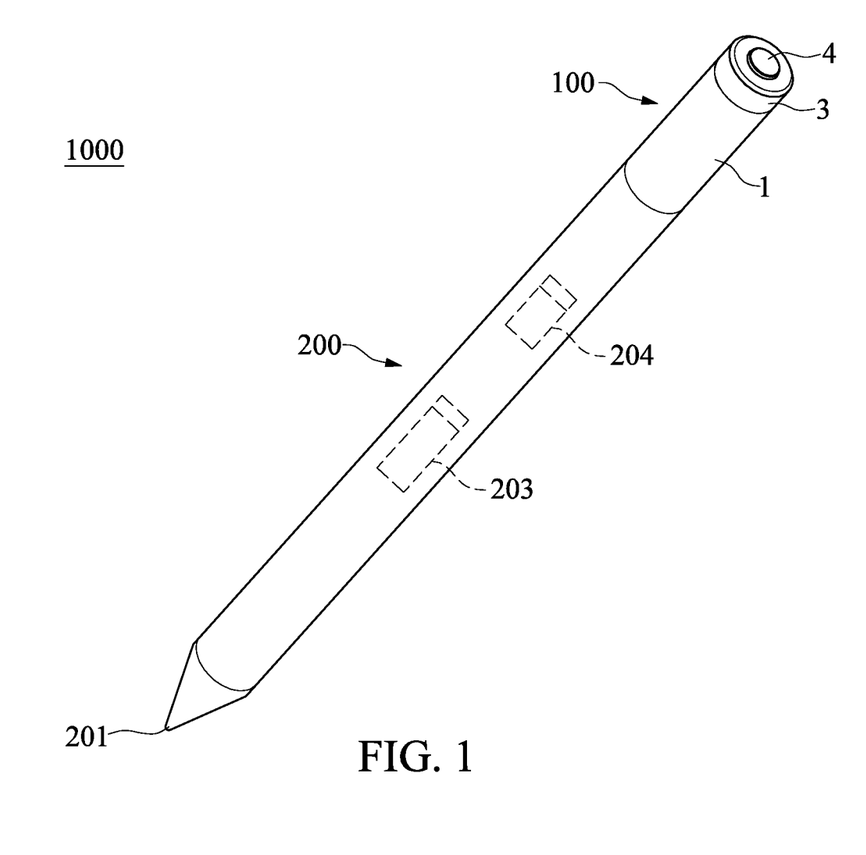
FIG. 1 is a perspective view showing a touch-controlling device according to an embodiment of the present disclosure.
Figure 2:
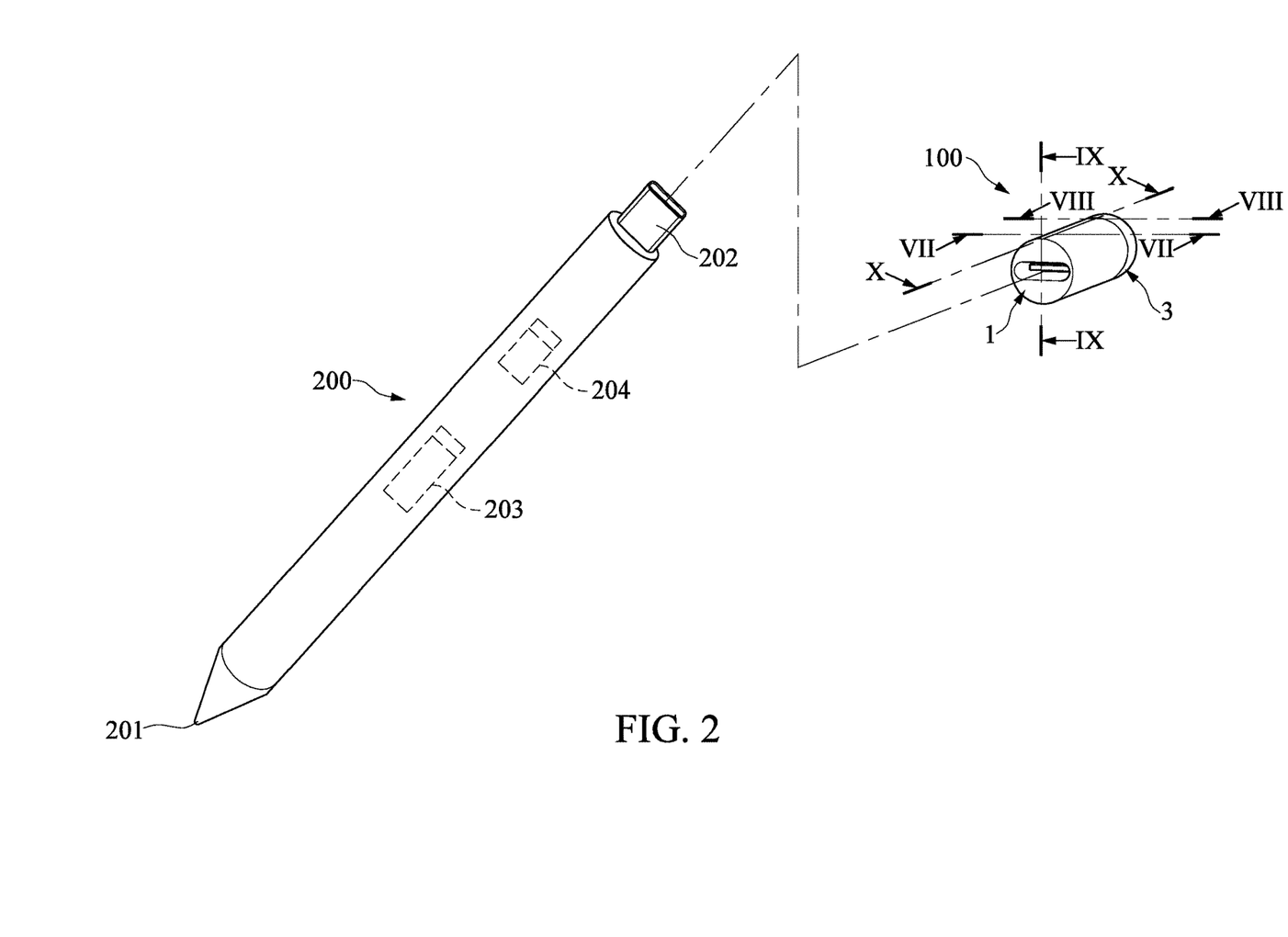
FIG. 2 is an exploded view of FIG. 1.

Reference is first made to FIGS. 1 and 2, which illustrate a touch-controlling device 1000 according to an embodiment of the present disclosure. The touch-controlling device 1000 includes a touch-controlling pen 200 and a functional expansion member 100 detachably fastened to the touch-controlling pen 200. It should be noted that the functional expansion member 100 in the present embodiment is cooperated with the touch-controlling pen 200, but the practical application of the functional expansion member 100 is not limited thereto. The following description discloses the structure and connection relationship of each component of the touch-controlling device 1000.

The touch-controlling pen 200 can be applied to a touch-control panel (e.g., a tablet PC or a smart phone), and the touch-controlling pen 200 in the present embodiment is an active touch-controlling pen. In other words, a passive touch-controlling pen cannot be regarded as the touch-controlling pen 200 of the present embodiment. Specifically, the touch-controlling pen 200 includes a touch-controlling nib 201 and a USB plug connector 202 both respectively arranged on two opposite ends thereof, and the USB plug connector 202 in the present embodiment has a USB3.1 Type-C interface. Moreover, the touch-controlling pen 200 further includes a power module 203 (i.e., a rechargeable battery) electrically connected to the touch-controlling nib 201 and the USB plug connector 202. That is to say, the power module 203 can provide or receive electricity by the USB plug connector 202.

Figure 3:
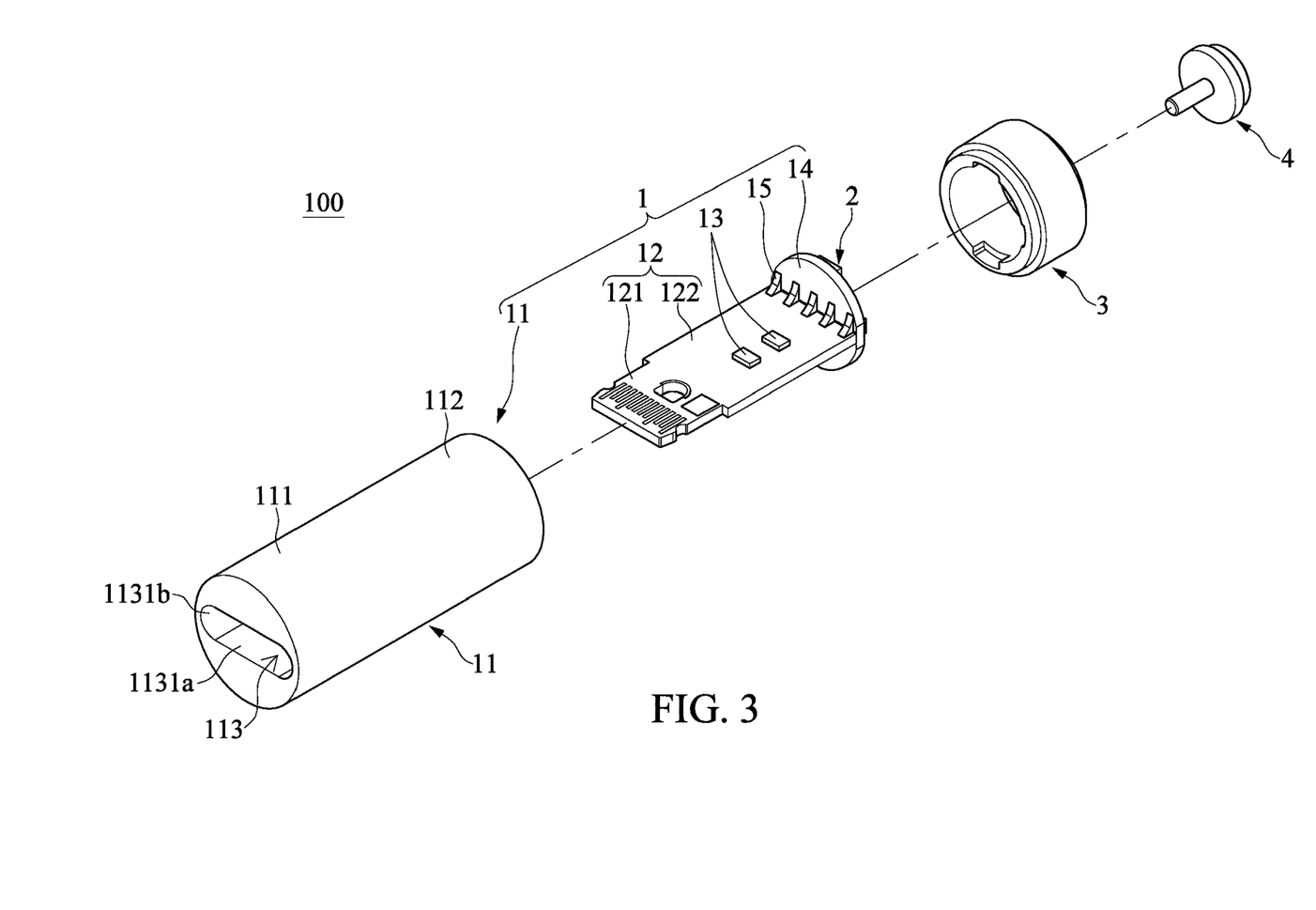
FIG. 3 is an exploded view of a functional expansion member of FIG. 2.
Figure 4:
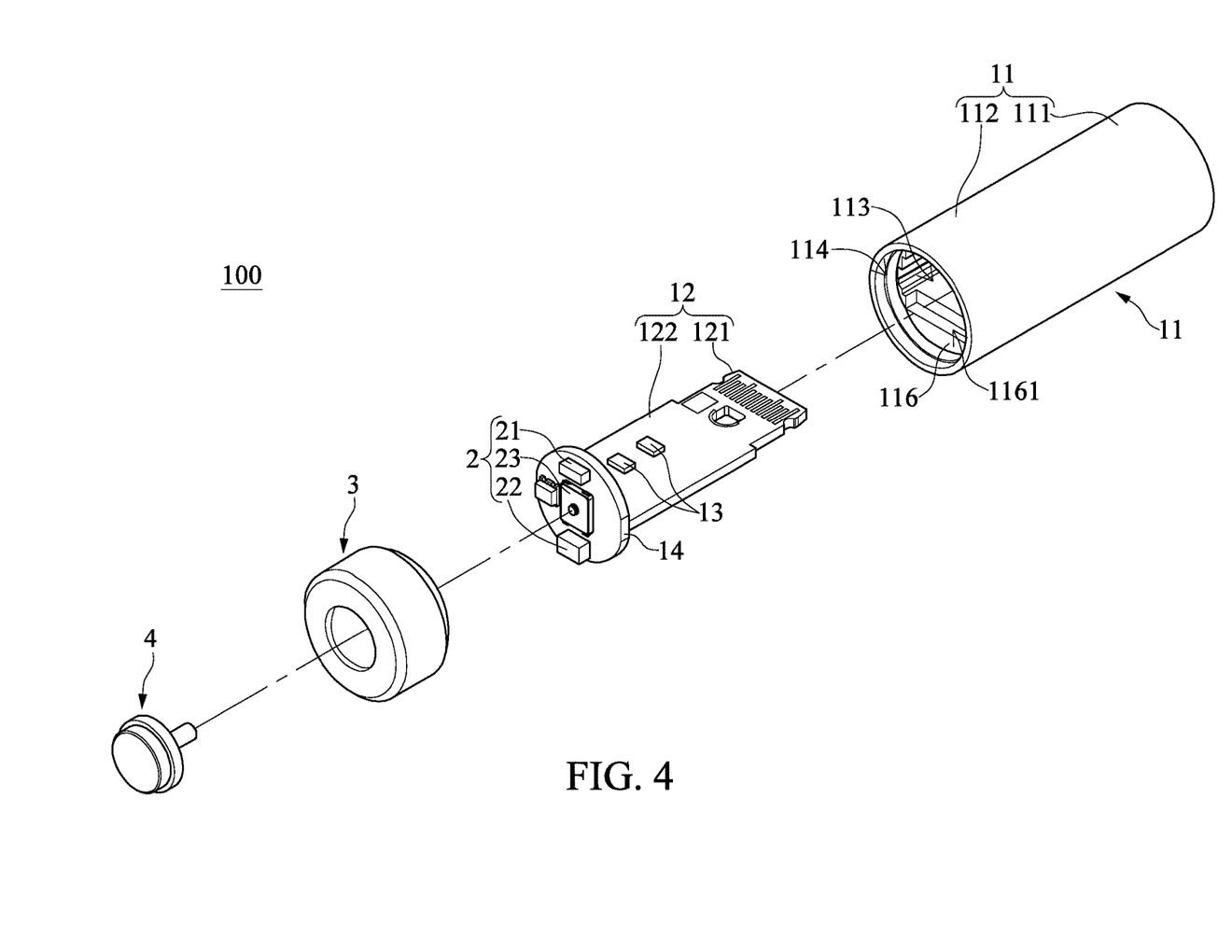
FIG. 4 is an exploded view of the functional expansion member of FIG. 2 from another perspective.

As shown in FIGS. 3 and 4, the functional expansion member 100 includes a USB socket connector 1, a functional module 2 mounted on the USB socket connector 1, an end cap 3 detachably fastened to the USB socket connector 1, and a transparent button 4 movably fastened to the end cap 3.

The USB socket connector 1 is detachably inserted into the USB plug connector 202 of the touch-controlling pen 200, so that the USB socket connector 1 and the USB plug connector 202 can be operated with each other to establish an electrical connection between the power module 203 of the touch-controlling pen 200 and the functional module 2 of the functional expansion member 100. Moreover, the USB socket connector 1 in the present embodiment is provided with the functional module 2, but the practical application of the USB socket connector 1 is not limited thereto.

Specifically, the USB socket connector 1 in the present embodiment includes a columnar housing 11, a circuit board 12 arranged in the columnar housing 11, a plurality of electronic components 13 mounted on the circuit board 12, an expansion board 14 connected to the circuit board 12 and arranged in the columnar housing 11, and a plurality of soldering portions 15 connecting the circuit board 12 and the expansion board 14.

The columnar housing 11 is not formed by bending a metallic sheet. The columnar housing 11 in the present embodiment is formed integrally as a one-piece structure, and the material of the columnar housing 11 can be changed according to designer requirements, such as a plastic or a metal. Moreover, an outer surface of the columnar housing 11 is preferably flush with that of the touch-controlling pen 200, and the columnar housing 11 in the present embodiment is a hollow cylindrical structure having a circular profile, but the present disclosure is not limited thereto. For example, in other embodiments of the present disclosure, each of the columnar housing 11 and the touch-controlling pen 200 can be a hollow cylindrical structure having a polygonal profile.

Figure 5:
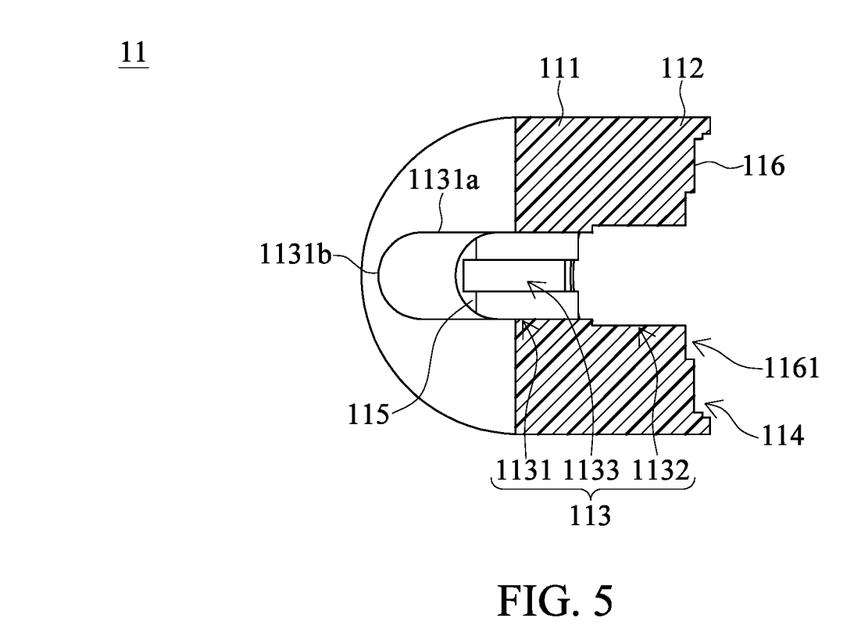
FIG. 5 is a perspective cross-sectional view showing a columnar housing of the functional expansion member.
Figure 6:
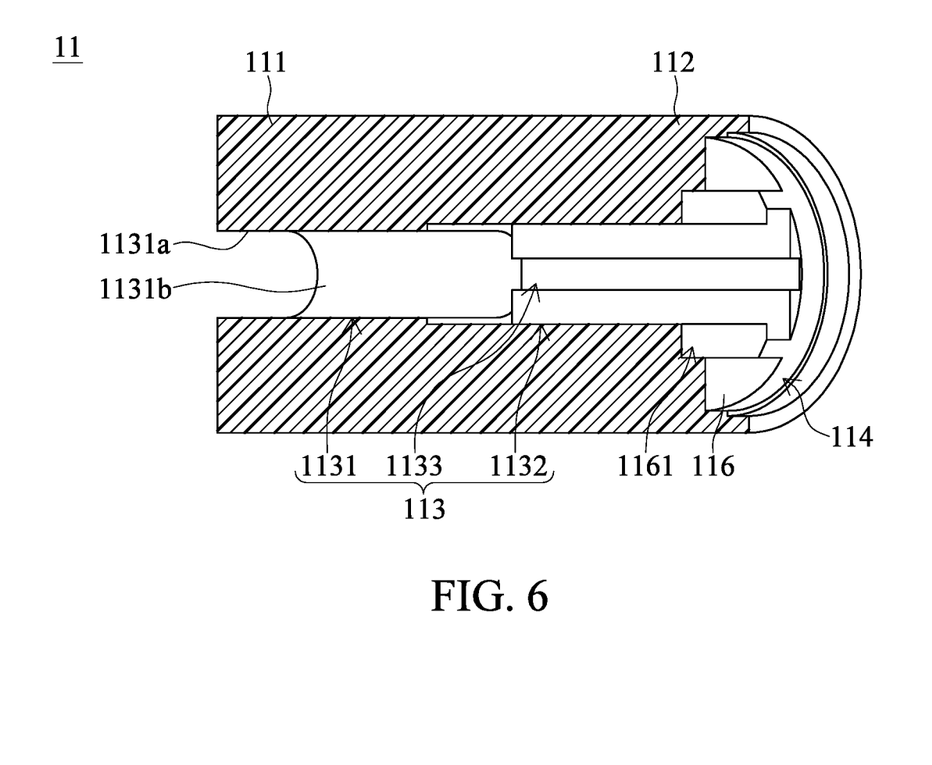
FIG. 6 is a perspective cross-sectional view showing the columnar housing of the functional expansion member from another perspective.

As shown in FIGS. 5 and 6, the columnar housing 11 has a front portion 111 and a rear portion 112 both respectively arranged on two opposite sides thereof. In other words, the rear portion 112 integrally extends from an end of the front portion 111. Moreover, the columnar housing 11 has an accommodating slot 113 recessed from the front portion 111 toward the rear portion 112, and the columnar housing 11 has a receiving slot 114 recessed on the rear portion 112 and in air communication with the accommodating slot 113. A cross section of the receiving slot 114 perpendicular to the longitudinal direction of the columnar housing 11 is larger than that of the accommodating slot 113.

Figure 7:
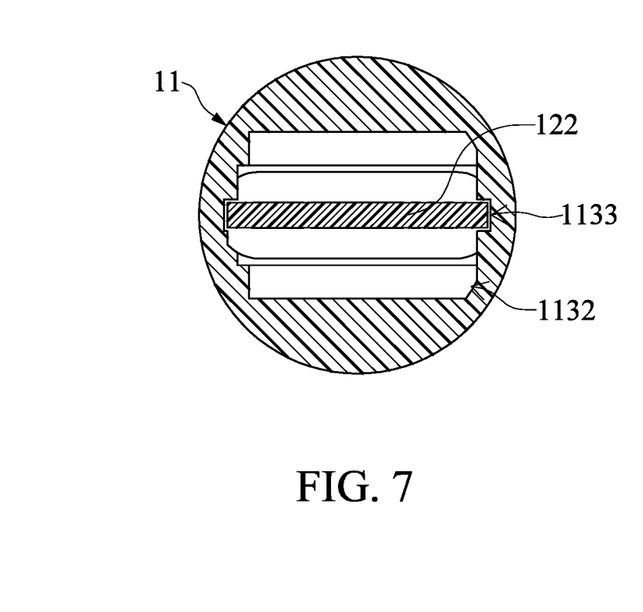
FIG. 7 is a cross-sectional view taken along a cross-sectional line VII-VII of FIG. 2.

Specifically, the accommodating slot 113 includes a front slot 1131 arranged in the front portion 111, a rear slot 1132 arranged in the rear portion 112, and two limiting slots 1133 arranged in the rear portion 112 and respectively arranged at two opposite sides of the rear slot 1132 (i.e., the left and right sides of the rear slot 1132 as shown in FIG. 7). The structure of the rear slot 1132 is different from that of the front slot 1131. In the present embodiment, the structure of the front slot 1131 is formed to accommodate the USB plug connector 202 of the touch-controlling pen 200, and the structure of the rear slot 1132 (and the two limiting slots 1133) is formed to accommodate the circuit board 12 and the electronic components 13.

Figure 8:
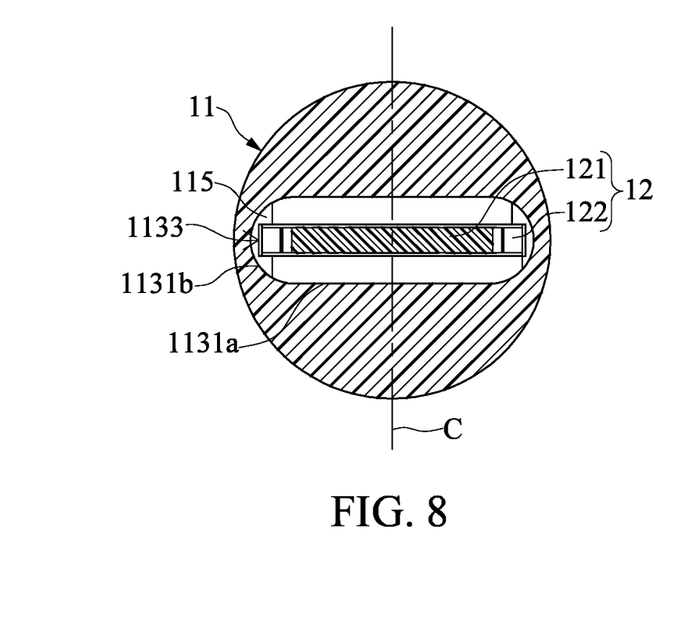
FIG. 8 is a cross-sectional view taken along a cross-sectional line VIII-VIII of FIG. 2.
Figure 9:
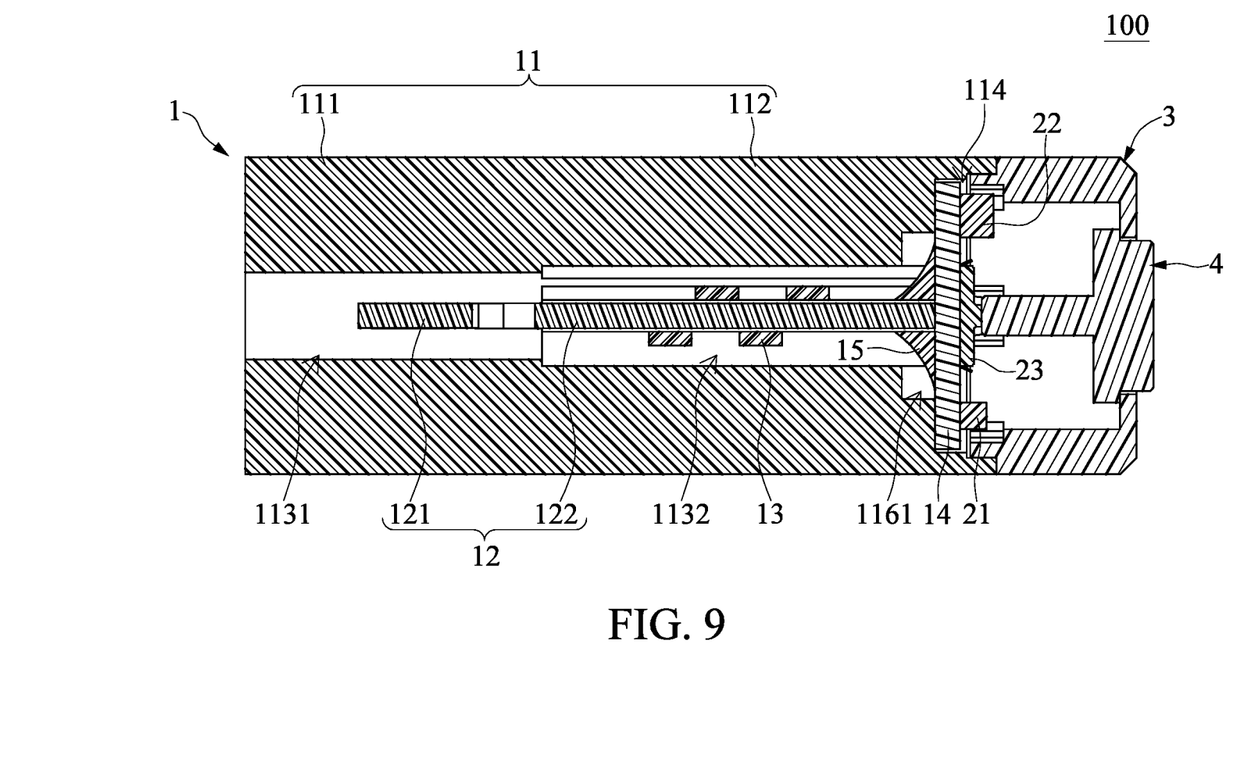
FIG. 9 is a cross-sectional view taken along a cross-sectional line IX-IX of FIG. 2.
Figure 10:
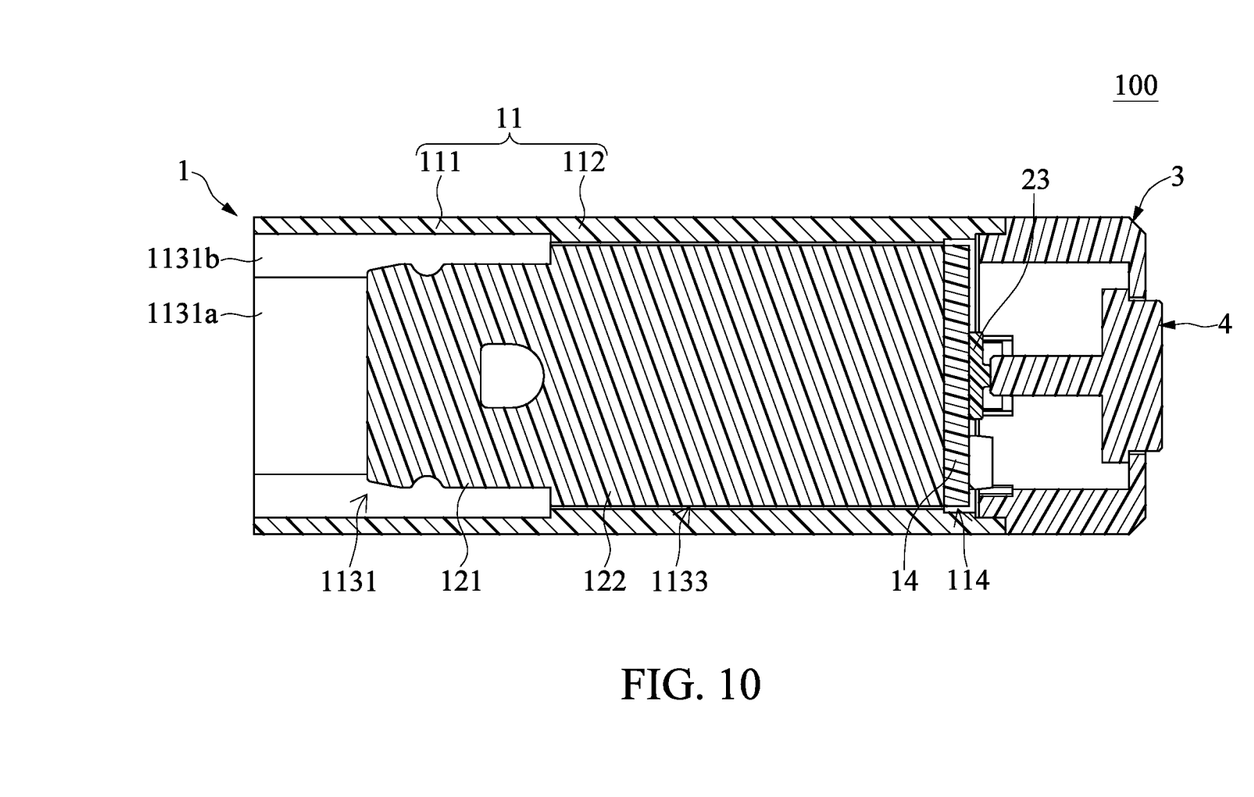
FIG. 10 is a cross-sectional view taken along a cross-sectional line X-X of FIG. 2.

The front slot 1131 includes two parallel planar walls 1131a and two curved walls 1131b. One of the two curved walls 1131b is connected to an end of the two planar walls 1131a, and the other curved wall 1131b is connected to the other end of the two planar walls 1131a. Moreover, in a cross section of the front slot 1131 perpendicular to the two planar walls 1131a (as shown in FIG. 8), each of the two curved walls 1131b is an arc shape having a center of circle arranged in the front slot 1131. The cross section of the front slot 1131 in the present embodiment is similar to an oval shape, but the present disclosure is not limited thereto.

The columnar housing 11 has two front end walls 115 and a rear end wall 116. The two front end walls 115 are arranged between the front slot 1131 and the rear slot 1132 and are defined as a bottom of the front slot 1131. The two front end walls 115 respectively correspond in position to the two curved walls 1131b, and the two front end walls 115 can be respectively and perpendicularly connected to the two curved walls 1131b. The rear end wall 116 is arranged on the rear end of the rear slot 1132 and is defined as a bottom of the receiving slot 114.

Moreover, the two limiting slots 1133 are respectively recessed from the two front end walls 115 to the rear end wall 116, and each of the two limiting slots 1133 is in air communication with the front slot 1131, the rear slot 1132, and the receiving slot 114. Specifically, a distance between bottoms of the two limiting slots 1133 is larger than a width of the rear slot 1132 and is slightly smaller than the largest distance between the two curved walls 1131b (i.e., a width of the front slot 1131 or a longitudinal axis of the oval shape). The rear end wall 116 has two notches 1161 respectively recessed on the upper and lower sides thereof, and the two notches 1161 are in air communication with the rear slot 1132 and the receiving slot 114.

As shown in FIGS. 3, 4, 9, and 10, the circuit board 12 includes a tongue plate portion 121 arranged on one side thereof and a carrying portion 122 connected to and coplanar with the tongue plate portion 121. In other words, the carrying portion 122 integrally extends from the tongue plate portion 121. The tongue plate portion 121 has a USB3.1 Type-C interface for inserting into the USB plug connector 202 of the touch-controlling pen 200. The electronic components 13 are mounted on the carrying portion 122.

The circuit board 12 is inserted into the accommodating slot 113 of the columnar housing 11, the tongue plate portion 121 is arranged in the front portion 111 (or the front slot 1131), and the carrying portion 122 is arranged in the rear portion 112 (or the rear slot 1132 and the two limiting slots 1133). In more detail, two opposite side parts of the carrying portion 122 are respectively inserted into the two limiting slots 1133, and the remaining part of the carrying portion 122 and the electronic components 13 are arranged in the rear slot 1132.

Specifically, a distance between the tongue plate portion 121 and one of the two planar walls 1131a of the front slot 1131 is equal to a distance between the tongue plate portion 121 and the other planar wall 1131a. In a circular cross section of the functional expansion member 100 perpendicular to the two planar walls 1131a, the tongue plate portion 121 is arranged at a diameter of the circular cross section, and a thickness of the columnar housing 11 gradually decreases from a perpendicular bisector C of the tongue plate portion 121 to two opposite sides of the perpendicular bisector C (i.e., the left and right sides of the perpendicular bisector C as shown in FIG. 8).

The expansion board 14 is substantially and perpendicularly connected to an end of the circuit board 12 away from the tongue plate portion 121 (i.e., the right end of the circuit board 12 as shown in FIG. 3). That is to say, an end of the carrying portion 122 away from the tongue plate portion 121 is substantially and perpendicularly connected to the expansion board 14. In the present embodiment, the expansion board 14 has a circular shape, and the end of the carrying portion 122 is connected to a diameter of an inner surface of the expansion board 14.

Moreover, the expansion board 14 is arranged in the receiving slot 114 and is disposed on the rear end wall 116 (i.e., the bottom of the receiving slot 114). The functional module 2 is mounted on an outer surface of the expansion board 14 which is non-connected to the circuit board 12. The soldering portions 15 are formed on two corners defined by the carrying portion 122 and the expansion board 14, so that the carrying portion 122 and the expansion board 14 can be structurally and electrically connected to each other by using the soldering portions 15. Moreover, the soldering portions 15 are respectively arranged in the two notches 1161.

Accordingly, when the USB plug connector 202 of the touch-controlling pen 200 is inserted into the USB socket connector 1 of the functional expansion member 100, the USB plug connector 202 is inserted into the front slot 1131 of the accommodating slot 113 and is electrically connected to the tongue plate portion 121 so as to establish an electrical connection between the functional module 2 and the touch-controlling pen 200, and the power module 203 of the touch-controlling pen 200 is capable of providing electricity to the functional module 2.

It should be noted that the functional module 2 of the touch-controlling device 1000 in the present embodiment is provided with a color capturing function, but the practical application of the functional module 2 can be adjusted or changed according designer requirements.

Specifically, the touch-controlling device 1000 includes a processor 204 installed in at least one of the touch-controlling pen 200 and the functional expansion member 100, and the processor 204 in the present embodiment is installed in the touch-controlling pen 200, but the present disclosure is not limited thereto. In other embodiments of the present disclosure, the processor 204 can be mounted on the outer surface of the expansion board 14 of the functional expansion member 100 (in other words, the functional module 2 includes the processor 204) or the carrying portion 122 of the circuit board 12 (in other words, one of the electronic components 13 mounted on the carrying portion 122 is the processor 204).

As shown in FIGS. 3, 4, 9, and 10, the functional module 2 includes a color extractor 21, a light-emitting unit 22, and a starter 23. The starter 23 is disposed on a substantial center portion of the outer surface of the expansion board 14, and the color extractor 21 and the light-emitting unit 22 are respectively disposed on two opposite sides of the starter 23, but the present disclosure is not limited thereto.

The color extractor 21 is electrically connected to the processor 204. The light-emitting unit 22 (i.e., an LED chip) is provided for emitting a white light. The starter 23 is electrically connected to the color extractor 21 and the light-emitting unit 22, and the starter 23 is pressable to drive the color extractor 21 and the light-emitting unit 22. Specifically, the color extractor 21 is configured for capturing an external color, and when the touch-controlling nib 201 touches the touch-control panel, the processor 204 is capable of instructing the touch-control panel to show the external color captured by the color extractor 21.

In addition, as shown in FIGS. 3, 4, 9, and 10, the end cap 3 is detachably fastened to the rear portion 112 of the columnar housing 11, and a part of the end cap 3 is arranged in the receiving slot 114 and corresponds in position to a peripheral portion of the outer surface of the expansion board 14. In other words, the peripheral portion of the expansion board 14 is substantially sandwiched between the rear end wall 116 (i.e., the bottom of the receiving slot 114) and the end cap 3, so that the circuit board 12 and the expansion board 14 can be firmly positioned between the columnar housing 11 and the end cap 3, but the present disclosure is not limited thereto.

The transparent button 4 is fastened to the end cap 3 and in contact with the starter 23, and the transparent button 4 is pressable to trigger the starter 23. Specifically, when the transparent button 4 is pressed onto an external object (not shown) having the external color, the starter 23 is triggered by the transparent button 4 to drive the light-emitting unit 22 and the color extractor 21, so that the light-emitting unit 22 emits a white light and the white light passes through the transparent button 4 and is projected onto the external object, and the color extractor 21 receives the white light reflected from the external object.

The Effects of the Above Embodiments

In summary, the touch-controlling device, the functional expansion member, or the USB socket connector is provided with the columnar housing to replace the conventional metallic shielding cover, so that the applied field of the USB socket connector (i.e., the USB socket connector can be applied to a touch-controlling pen) is more wide-ranging than that of the conventional USB socket connector.

Moreover, the functional module of the functional expansion member in the present disclosure is provided with a color capturing function, so that the touch-controlling pen collaborating with the functional expansion member has higher value added. For the structure of the touch-controlling device, the functional expansion member is just cooperated with the USB plug connector of the touch-controlling pen, so that the structure of the touch-controlling pen needs not to be changed for the functional expansion member, thereby effectively reducing the cost of the touch-controlling device.

The descriptions illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. A touch-controlling device, comprising:
    a touch-controlling pen including a touch-controlling nib and a USB plug connector both respectively arranged on two opposite ends thereof, the USB plug connector having a USB3.1 Type-C interface, wherein the touch-controlling pen includes a power module electrically connected to the touch-controlling nib and the USB plug connector; and
    a functional expansion member including a USB socket connector and a functional module mounted on the USB socket connector, wherein the USB socket connector is detachably inserted into the USB plug connector of the touch-controlling pen and includes:
        a columnar housing having a front portion and a rear portion both respectively arranged on two opposite sides thereof, wherein the columnar housing has an accommodating slot recessed from the front portion toward the rear portion and a receiving slot recessed on the rear portion and in spatial communication with the accommodating slot, and a cross section of the receiving slot perpendicular to a longitudinal direction of the columnar housing is larger than that of the accommodating slot;
        a circuit board including a tongue plate portion arranged on one side thereof, the tongue plate portion having a USB3.1 Type-C interface, wherein the circuit board is inserted into the accommodating slot, and the tongue plate portion is arranged in the front portion; and
        an expansion board substantially and perpendicularly connected to an end of the circuit board away from the tongue plate portion, wherein the expansion board is arranged in the receiving slot, and the functional module is mounted on an outer surface of the expansion board non-connected to the circuit board,
    wherein when the USB plug connector of the touch-controlling pen is inserted into the USB socket connector of the functional expansion member, the USB plug connector is inserted into the accommodating slot and is electrically connected to the tongue plate portion so as to establish an electrical connection between the functional module and the touch-controlling pen, and the power module of the touch-controlling pen is capable of providing electricity to the functional module.

2. The touch-controlling device as claimed in claim 1, wherein the accommodating slot includes:
    a front slot arranged in the front portion and including two parallel planar walls and two curved walls, wherein a distance between the tongue plate portion and one of the two planar walls is equal to a distance between the tongue plate portion and the other planar wall, one of the two curved walls is connected to an end of the two planar walls, and the other curved wall is connected to the other end of the two planar walls; and
    a rear slot arranged in the rear portion, wherein the structure of the rear slot is different from that of the front slot.

3. The touch-controlling device as claimed in claim 2, wherein the columnar housing has a hollow cylindrical structure having a circular profile, an outer surface of the columnar housing is flush with that of the touch-controlling pen, wherein in a circular cross section of the functional expansion member perpendicular to the two planar walls, the tongue plate portion is arranged at a diameter of the circular cross section, and a thickness of the columnar housing gradually decreases from a perpendicular bisector of the tongue plate portion to two opposite sides.

4. The touch-controlling device as claimed in claim 2, wherein the columnar housing has two front end walls and a rear end wall, the two front end walls are arranged between the front slot and the rear slot and are defined as a bottom of the front slot, the two front end walls respectively correspond in position to the two curved walls, and the rear end wall is arranged on the rear end of the rear slot and is defined as a bottom of the receiving slot.

5. The touch-controlling device as claimed in claim 4, wherein each of the two front end walls has a limiting slot substantially recessed thereon and in spatial communication with the rear slot and the receiving slot, the circuit board has a carrying portion connected to the tongue plate portion, an end of the carrying portion away from the tongue plate portion is perpendicularly connected to the expansion board, and two opposite side parts of the carrying portion are respectively inserted into the two limiting slots.

6. The touch-controlling device as claimed in claim 4, wherein the rear end wall has two notches recessed thereon, the expansion board is disposed on the rear end wall, the USB socket connector further includes a plurality of soldering portions structurally and electrically connecting the circuit board and the expansion board, and the soldering portions are respectively arranged in the two notches.

7. The touch-controlling device as claimed in claim 1, further comprising a processor installed in at least one of the touch-controlling pen and the functional expansion member, wherein the functional module includes:
 a color extractor electrically connected to the processor;
 a light-emitting unit for emitting a white light; and
 a starter electrically connected to the color extractor and the light-emitting unit, the starter being pressable to drive the color extractor and the light-emitting unit, wherein the color extractor is configured for capturing an external color, and when the touch-controlling nib touches a touch-control panel, the processor is capable of instructing the touch-control panel to show the external color captured by the color extractor.

8. The touch-controlling device as claimed in claim 7, wherein the starter is disposed on a substantial center portion of the outer surface of the expansion board, the color extractor and the light-emitting unit are respectively disposed on two opposite sides of the starter, and the functional expansion member further includes:
 an end cap detachably fastened to the rear portion of the columnar housing, wherein a part of the end cap is arranged in the receiving slot and corresponds in position to a peripheral portion of the outer surface of the expansion board; and
 a transparent button fastened to the end cap and being in contact with the starter, wherein the transparent button is pressable to trigger the starter,
 wherein when the transparent button is pressed onto an external object having the external color, the starter is triggered by the transparent button to drive the light-emitting unit and the color extractor, so that the light-emitting unit emits a white light and the white light passes through the transparent button and is projected onto the external object, and the color extractor receives the white light reflected from the external object.

9. A functional expansion member of a touch-controlling device, comprising:
 a USB socket connector including:
  a columnar housing having a front portion and a rear portion both respectively arranged on two opposite sides thereof, wherein the columnar housing has an accommodating slot recessed from the front portion toward the rear portion and a receiving slot recessed on the rear portion and in spatial communication with the accommodating slot, and a cross section of the receiving slot perpendicular to a longitudinal direction of the columnar housing is larger than that of the accommodating slot;
  a circuit board including a tongue plate portion arranged on one side thereof, the tongue plate portion having a USB3.1 Type-C interface, wherein the circuit board is inserted into the accommodating slot, and the tongue plate portion is arranged in the front portion; and
  an expansion board substantially and perpendicularly connected to an end of the circuit board away from the tongue plate portion, wherein the expansion board is arranged in the receiving slot; and
 a functional module mounted on the expansion board of the USB socket connector and including:
  a processor;
  a color extractor electrically connected to the processor;
  a light-emitting unit for emitting a white light; and
  a starter electrically connected to the color extractor and the light-emitting unit, wherein the starter is pressable to drive the color extractor and the light-emitting unit.

10. The functional expansion member as claimed in claim 9, wherein the accommodating slot includes:
 a front slot arranged in the front portion and including two parallel planar walls and two curved walls, wherein a distance between the tongue plate portion and one of the two planar walls is equal to a distance between the tongue plate portion and the other planar wall, one of the two curved walls is connected to an end of the two planar walls, and the other curved wall is connected to the other end of the two planar walls; and
 a rear slot arranged in the rear portion, wherein the structure of the rear slot is different from that of the front slot.

11. The functional expansion member as claimed in claim 10, wherein the columnar housing has a hollow cylindrical structure having a circular profile, wherein in a circular cross section of the functional expansion member perpendicular to the two planar walls, the tongue plate portion is arranged at a diameter of the circular cross section, and a thickness of the columnar housing gradually decreases from a perpendicular bisector of the tongue plate portion to two opposite sides.

12. The functional expansion member as claimed in claim 10, wherein the columnar housing has two front end walls and a rear end wall, the two front end walls are arranged between the front slot and the rear slot and are defined as a bottom of the front slot, the two front end walls respectively correspond in position to the two curved walls, and the rear end wall is arranged on the rear end of the rear slot and is defined as a bottom of the receiving slot.

13. The functional expansion member as claimed in claim 12, wherein each of the two front end walls has a limiting slot substantially recessed thereon and in spatial communication with the rear slot and the receiving slot, the circuit board has a carrying portion connected to the tongue plate portion, an end of the carrying portion away from the tongue plate portion is perpendicularly connected to the expansion board, and two opposite side parts of the carrying portion are respectively inserted into the two limiting slots.

14. The functional expansion member as claimed in claim 12, wherein the rear end wall has two notches recessed thereon, the expansion board is disposed on the rear end wall, the USB socket connector further includes a plurality of soldering portions structurally and electrically connecting the circuit board and the expansion board, and the soldering portions are respectively arranged in the two notches.

15. The functional expansion member as claimed in claim 9, wherein the starter is disposed on a substantial center portion of an outer surface of the expansion board, the color extractor and light-emitting unit are respectively disposed on two opposite sides of the starter, and the functional expansion member further includes:
- an end cap detachably fastened to the rear portion of the columnar housing, wherein a part of the end cap is arranged in the receiving slot and correspond in position to a peripheral portion of the outer surface of the expansion board; and
- a transparent button fastened to the end cap and being in contact with the starter, wherein the transparent button is pressable to trigger the starter,
- wherein when the transparent button is pressed onto an external object, the starter is triggered by the transparent button to drive the light-emitting unit and the color extractor, so that the light-emitting unit emits a white light and the white light passes through the transparent button and is projected onto the external object, and the color extractor receives the white light reflected from the external object.

16. A USB socket connector, comprising:
- a columnar housing having a front portion and a rear portion both respectively arranged on two opposite sides thereof, wherein the columnar housing has an accommodating slot recessed from the front portion toward the rear portion and a receiving slot recessed on the rear portion and in spatial communication with the accommodating slot, and a cross section of the receiving slot perpendicular to a longitudinal direction of the columnar housing is larger than that of the accommodating slot;
- a circuit board including a tongue plate portion arranged on one side thereof, the tongue plate portion having a USB3.1 Type-C interface, wherein the circuit board is inserted into the accommodating slot, and the tongue plate portion is arranged in the front portion, wherein the accommodating slot includes:
    - a front slot arranged in the front portion and including two parallel planar walls and two curved walls, wherein a distance between the tongue plate portion and one of the two planar walls is equal to a distance between the tongue plate portion and the other planar wall, one of the two curved walls is connected to an end of the two planar walls, and the other curved wall is connected to the other end of the two planar walls; and
    - a rear slot arranged in the rear portion, wherein the structure of the rear slot is different from that of the front slot; and
- an expansion board substantially and perpendicularly connected to an end of the circuit board away from the tongue plate portion, wherein the expansion board is arranged in the receiving slot.

17. The USB socket connector as claimed in claim 16, wherein the columnar housing has two front end walls and a rear end wall, the two front end walls are arranged between the front slot and the rear slot and are defined as a bottom of the front slot, the two front end walls respectively correspond in position to the two curved walls, and the rear end wall is arranged on the rear end of the rear slot and is defined as a bottom of the receiving slot.

18. The USB socket connector as claimed in claim 17, wherein each of the two front end walls has a limiting slot substantially recessed thereon and in spatial communication with the rear slot and the receiving slot, the circuit board has a carrying portion connected to the tongue plate portion, an end of the carrying portion away from the tongue plate portion is perpendicularly connected to the expansion board, and two opposite side parts of the carrying portion are respectively inserted into the two limiting slots.

19. The USB socket connector as claimed in claim 17, wherein the rear end wall has two notches recessed thereon, the expansion board is disposed on the rear end wall, the USB socket connector further includes a plurality of soldering portions structurally and electrically connecting the circuit board and the expansion board, and the soldering portions are respectively arranged in the two notches.

\* \* \* \* \*